(12) United States Patent
Mao

(10) Patent No.: US 8,456,826 B2
(45) Date of Patent: Jun. 4, 2013

(54) FLASH MEMORY STICK

(75) Inventor: Ze-Jun Mao, Shenzhen (CN)

(73) Assignees: Hong Fu Jin Precision Industry (ShenZhen) Co., Ltd., Shenzhen (CN); Hon Hai Precision Industry Co., Ltd., New Taipei (TW)

( * ) Notice: Subject to any disclaimer, the term of this patent is extended or adjusted under 35 U.S.C. 154(b) by 393 days.

(21) Appl. No.: 12/978,601

(22) Filed: Dec. 26, 2010

(65) Prior Publication Data

US 2012/0147544 A1    Jun. 14, 2012

(30) Foreign Application Priority Data

Dec. 9, 2010   (CN) .......................... 2010 1 0581114

(51) Int. Cl.
 *G06F 1/16*   (2006.01)

(52) U.S. Cl.
 USPC .............. 361/679.31; D14/480.1; D14/484.1; 439/131

(58) Field of Classification Search
 USPC ........... 361/679.31; D14/480.6, 480.1, 484.1; 439/131, 76.1
 See application file for complete search history.

(56) References Cited

U.S. PATENT DOCUMENTS

| | | | |
|---|---|---|---|
| 7,074,052 B1 * | 7/2006 | Ni et al. | 439/76.1 |
| D572,248 S * | 7/2008 | Jen | D14/480.5 |
| 7,407,390 B1 * | 8/2008 | Ni | 439/76.1 |
| 7,462,044 B1 * | 12/2008 | Regen et al. | 439/131 |
| D606,077 S * | 12/2009 | Hu et al. | D14/480.1 |
| D618,694 S * | 6/2010 | Andre | D14/480.6 |
| 7,920,386 B2 * | 4/2011 | Tsao et al. | 361/755 |
| D638,001 S * | 5/2011 | Nakhjiri et al. | D14/242 |
| D642,584 S * | 8/2011 | Wong et al. | D14/480.4 |
| 8,125,774 B2 * | 2/2012 | Kelley et al. | 361/679.31 |
| 2006/0073717 A1 * | 4/2006 | Ng et al. | 439/131 |
| 2010/0328874 A1 * | 12/2010 | Ko | 361/679.32 |

* cited by examiner

*Primary Examiner* — Lisa Lea Edmonds
(74) *Attorney, Agent, or Firm* — Altis Law Group, Inc.

(57) ABSTRACT

A flash memory stick includes a clasp member, a connecting member, and a USB connector. The clasp member extends along a first direction and the connecting member extending from an end of the clasp member and along a second direction. The USB connector extending from an end of the connecting member and along a third direction. The second direction is different from the first direction and the third direction.

10 Claims, 2 Drawing Sheets

FLASH MEMORY STICK

BACKGROUND

1. Technical Field

The present disclosure generally relates to a storage apparatus, and more particularly to a flash memory stick.

2. Discussion of Related Art

Flash memory sticks usually include a USB connector and a body member connected to the USB connector. The extending direction of the flash memory stick is the same as the personal computers USB connector. Usually, a notebook computer is arranged on a work desk, the flash memory stick needs to be inserted into the notebook computer. However, the notebook computer is very thin, therefore, it is hard to insert and remove the flash memory stick.

Therefore, what is needed is a flash memory stick, which can overcome the above described shortcomings.

BRIEF DESCRIPTION OF THE DRAWINGS

Many aspects of the present embodiments can be better understood with reference to the following drawings. The components in the drawings are not necessarily drawn to scale, the emphasis instead being placed upon clearly illustrating the principles of the present embodiments. Moreover, in the drawings, all the views are schematic, and like reference numerals designate corresponding parts throughout the several views.

DETAILED DESCRIPTION OF EMBODIMENTS

Reference will now be made to the drawings to describe various embodiments of the present flash memory stick in detail.

Figure 1:
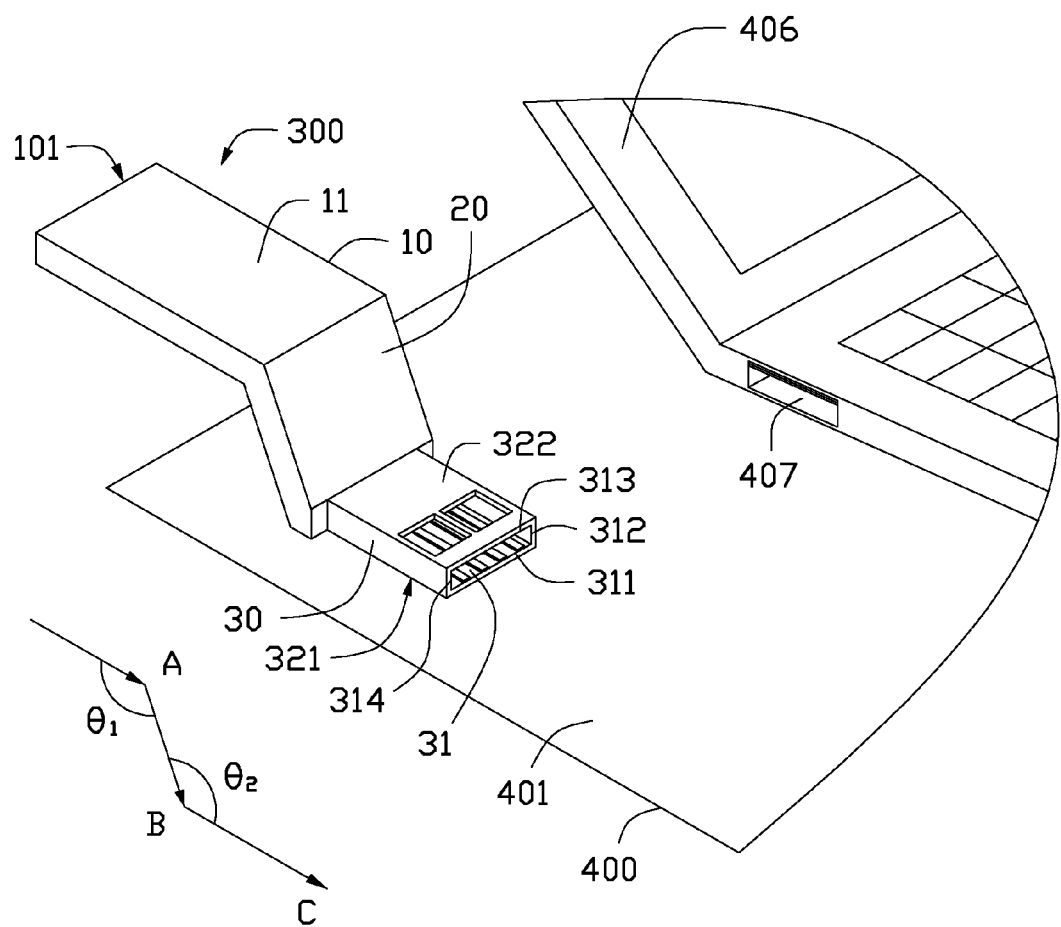
FIG. 1 is a partial e view of a flash memory stick matched with an electronic device in accordance with a first embodiment of the present disclosure.

Referring to FIG. 1, a flash memory stick 100, in accordance with a present embodiment is shown. The flash memory stick 100 is configured for insertion into a USB socket 407 of an electronic device 406 arranged on a supporting surface 401 of a workspace 400.

The flash memory stick 100 includes a clasp member 10 extending from a terminal surface 101 and along a first direction A. A connecting member 20 extends from one end of the clasp member 10 and along a second direction B. A USB connector 30 extends from an end of the connecting member 20 and along a third direction C.

In the present embodiment, the clasp member 10 is rectangular shaped and has an upper surface 11 extending along the first direction A. The upper surface 11 is away from the supporting surface 401 of the workspace 400. The clasp member 10 is integrally formed with the connecting member 20. The flash memory stick 100 includes a printed circuit board (not shown) therein performing a data storage function. The USB connector 30 communicates with the electronic device 406 by the printed circuit board. The printed circuit board is received in the clasp member 10 and the connecting member 20. An angle $\theta_1$ is defined by the first direction A and the second direction B that is an obtuse angle.

The USB connector 30 includes a rectangular opening 31 away from the clasp member 10 configured for connecting to the USB socket 407 of the electronic device 406. The opening 31 includes a first long side 311, a second long side 313 opposite to the first long side 311, a first short side 312, and a second short side 314 arranged between the first long side 311 and the second long side 313. The USB connector 30 includes a first surface 321 extending through the first long side 311 and a second surface 322 opposite to the first surface 321. When using the flash memory stick 100, the first surface 321 is close to the supporting surface 401 of the workspace 400.

In the present embodiment, the clasp member 20 and the connecting member 30 are arranged at a side away from the first surface 321 of the USB connector 30. An angle $\theta_2$ defined by the first direction A and the second direction B that is an obtuse angle.

In the present embodiment, the first direction A is same as the third direction C, and the first surface 321 of the USB connector 30 is parallel to the upper surface 11 of the clasp member 10.

The flash memory stick 100 is easily inserted or removed from the USB socket 407 of the electronic device 406, and the flash memory stick 100 is decorative because it can be styled into different shapes.

Figure 2:
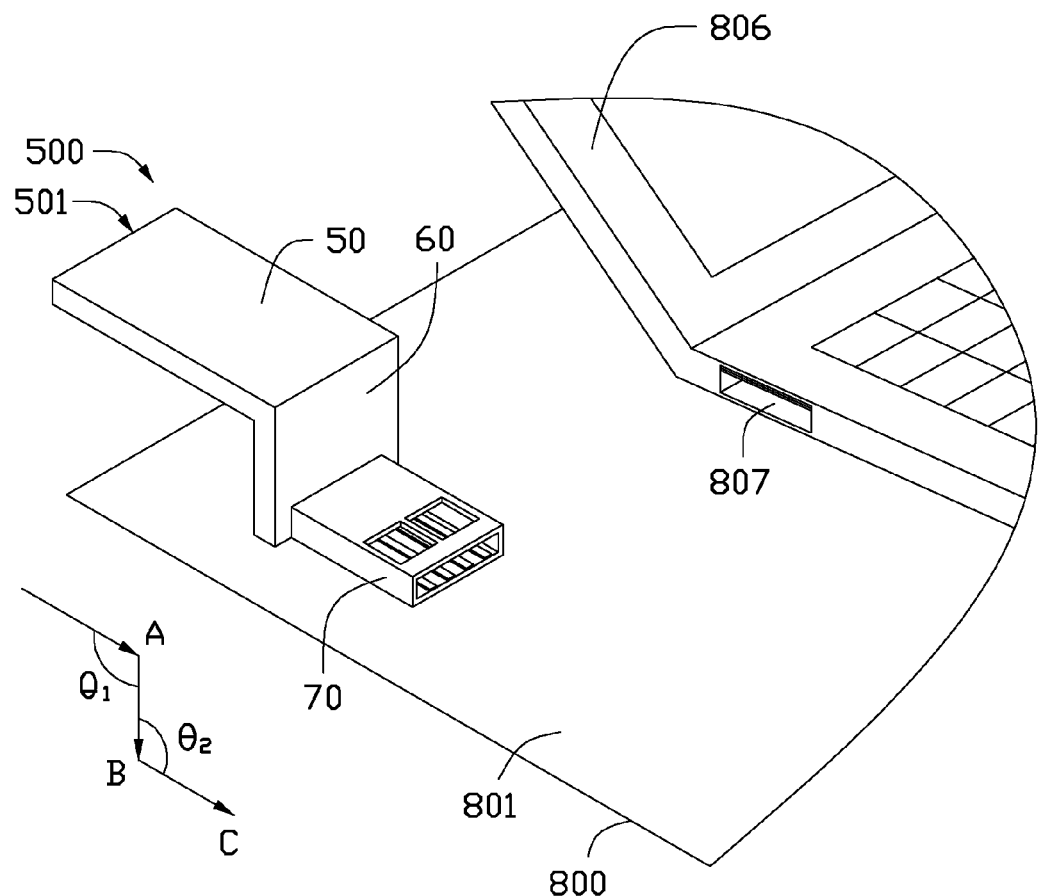
FIG. 2 is a partial e view of a flash memory stick matched with the electronic device in accordance with a second embodiment of the present disclosure.

Referring to FIG. 2, a flash memory stick 500, in accordance with the present embodiment is shown. The flash memory stick 500 is configured for insertion into a USB socket 807 of an electronic device 806 arranged on a supporting surface 801 of a workspace 800. The flash memory stick 500 includes a clasp member 50 extending from a terminal surface 501 and along a first direction A. A connecting member 60 extends from one end of the clasp member 50 and along a second direction B. A USB connector 70 extends from one end of the connecting member 60 and along a third direction C. Differing from the flash memory stick 100 of FIG. 1, the second direction B, of flash memory stick 500, is perpendicular to the first direction A and the third direction C. The flash memory stick 500 can be in the form of a "Z".

In other embodiments, the angle $\theta_1$ is defined by the first direction A and the second direction B, and the angle $\theta_2$ is defined by the first direction A and the second direction B that can be acute angle, right angle, or obtuse angle, whether alone or in any combination.

It is to be further understood that even though numerous characteristics and advantages have been set forth in the foregoing description of embodiments, together with details of the structures and functions of the embodiments, the disclosure is illustrative only; and that changes may be made in detail, especially in matters of shape, size, and arrangement of parts within the principles of the disclosure to the full extent indicated by the broad general meaning of the terms in which the appended claims are expressed.

What is claimed is:

1. A flash memory stick comprising:
   a clasp member extending along a first direction;
   a connecting member extending from an end of the clasp member and along a second direction; and
   a USB connector extending from an end of the connecting member and along a third direction;
   wherein the second direction is different from the first direction and the third direction.

2. The flash memory stick of claim 1, wherein the first direction is same as the third direction.

3. The flash memory stick of claim 1, wherein the USB connector comprises a rectangular opening, the opening comprising a first long side and a short side adjacent to the long side, the USB connector comprising a first surface extending through the first long side, the clasp member and the connecting member being arranged at a side away from the first surface, the clasp member having an upper surface extending along the first direction and away from the first surface, the upper surface being parallel to the first surface.

4. The flash memory stick of claim 1, wherein the clasp member has a rectangular shape.

5. The flash memory stick of claim 1, wherein the clasp member and the connecting member are arranged at a side away from the first surface of the USB connector.

6. The flash memory stick of claim 1, wherein an angle is defined by the second direction and the third direction is an obtuse angle.

7. The flash memory stick of claim 1, wherein the second direction is perpendicular to the third direction.

8. The flash memory stick of claim 1, wherein the first direction is perpendicular to the second direction.

9. The flash memory stick of claim 1, wherein an angle is defined by the first direction and the second direction is an obtuse angle.

10. The flash memory stick of claim 1, wherein the Flash memory stick has a "Z" shape.

* * * * *